(12) United States Patent
Wickersham

(10) Patent No.: US 6,380,722 B2
(45) Date of Patent: *Apr. 30, 2002

(54) METHOD TO INCREASE THE EFFICIENCY OF A POWER SWITCHING DEVICE

(75) Inventor: Robert D. Wickersham, Lacey, WA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/514,384

(22) Filed: Feb. 28, 2000

(51) Int. Cl.⁷ ................................................ G05F 1/40
(52) U.S. Cl. ........................ 323/282; 323/222; 323/908; 323/301; 361/18; 361/94
(58) Field of Search .................................. 323/222, 908, 323/259, 301, 303, 282; 361/18, 94

(56) References Cited

U.S. PATENT DOCUMENTS

| | | | | |
|---|---|---|---|---|
| 5,420,780 A | * | 5/1995 | Bernstein et al. | 363/89 |
| 5,929,614 A | * | 7/1999 | Copple | 323/282 |
| 6,091,615 A | * | 7/2000 | Inoshita et al. | 363/40 |

\* cited by examiner

Primary Examiner—Peter S. Wong
Assistant Examiner—Gary L. Laxton
(74) Attorney, Agent, or Firm—Antonelli, Terry, Stout & Kraus, LLP

(57) ABSTRACT

A method for limiting a switching current and limiting a voltage drop across a circuit includes the steps of limiting a current sent from a power source to a switching device during a turn on time of the switching device by disposing an inductor device in series between the power source and said switching device and returning flux energy stored in said inductor device to the power source during a turn off time of the switching device.

40 Claims, 6 Drawing Sheets

METHOD TO INCREASE THE EFFICIENCY OF A POWER SWITCHING DEVICE

FIELD

The invention relates to a method for limiting the switching current of a switching device and therefore limiting the power dissipated by the switching device at turn-on time, and further returning energy to a power receiving circuit when the switching device disconnects from the power source.

BACKGROUND

During the turn-on time for a switching device, which may include, but is not limited to, an FET or bipolar transistor, wasteful transition power is dissipated during a transition turn-on time. Thus, the longer the transition turn-on time lasts, the more wasteful power is dissipated.

FIG. 1 shows, for example, a MOSFET switching device 10 which switches a voltage from $^+V$ to the input of inductor 20 in a simple buck regulator. It is known to provide a buck regulator, which includes an inductor 20, capacitor 30 and freewheel diode 50 and switching device 10 for producing a first regulated output voltage across the capacitor 30 from a pulsed input supply. Controller 60 is provided to control the duty cycle of the switching device 10. During the transition turn-on time required for the switching device 10 (which may be, but is not limited to, an FET or bipolar transistor), transition power is dissipated, and the longer the transition, in relation to the repetition period of the transition, the more power is dissipated, as further illustrated in this example.

More particularly, the disadvantageous example embodiment of FIG. 1 shows a buck regulator which utilizes a switching device 10, which is used to switch the input of inductor 20 to the input voltage $^+V$ for a period of time, and then to disconnect inductor 20 from $^+V$ for a subsequent period of time. If switching device 10 has to switch 15A (i.e., 15 amps), the power being switched will be given by the formula $15\times{}^+V$. If $^+V$ were 20V, then the power switched would be 300 watts, since (15A)(20V)=300watts. That is, as an example, when 15A are transmitted from source $^+V$, and when transistor 10 is turned on, the left side of inductor 20 charges up to $^+V$, which is the voltage level from the power source. Current begins to increase through inductor 20 and capacitor 30 is charged up. In a stable state, the charge on capacitor 30 rises above the output voltage and then back down below the output voltage, producing a ripple. In this example, then, the transistor 10 would be immediately switching 15A at turn-on time, and therefore would be wasting a significant amount of power during turn-on transition time.

SUMMARY

According to the invention, a method, including the steps of limiting a current sent from a power source to a switching device, and system are provided for limiting a switching current in a switching device during the transition turn-on time of the switching device by disposing an inductor device in series between the power source and the switching device, and returning flux energy stored in the inductor device to a power receiving circuit at a turn-off time of the switching device.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written disclosure focus on disclosing example embodiments of this invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
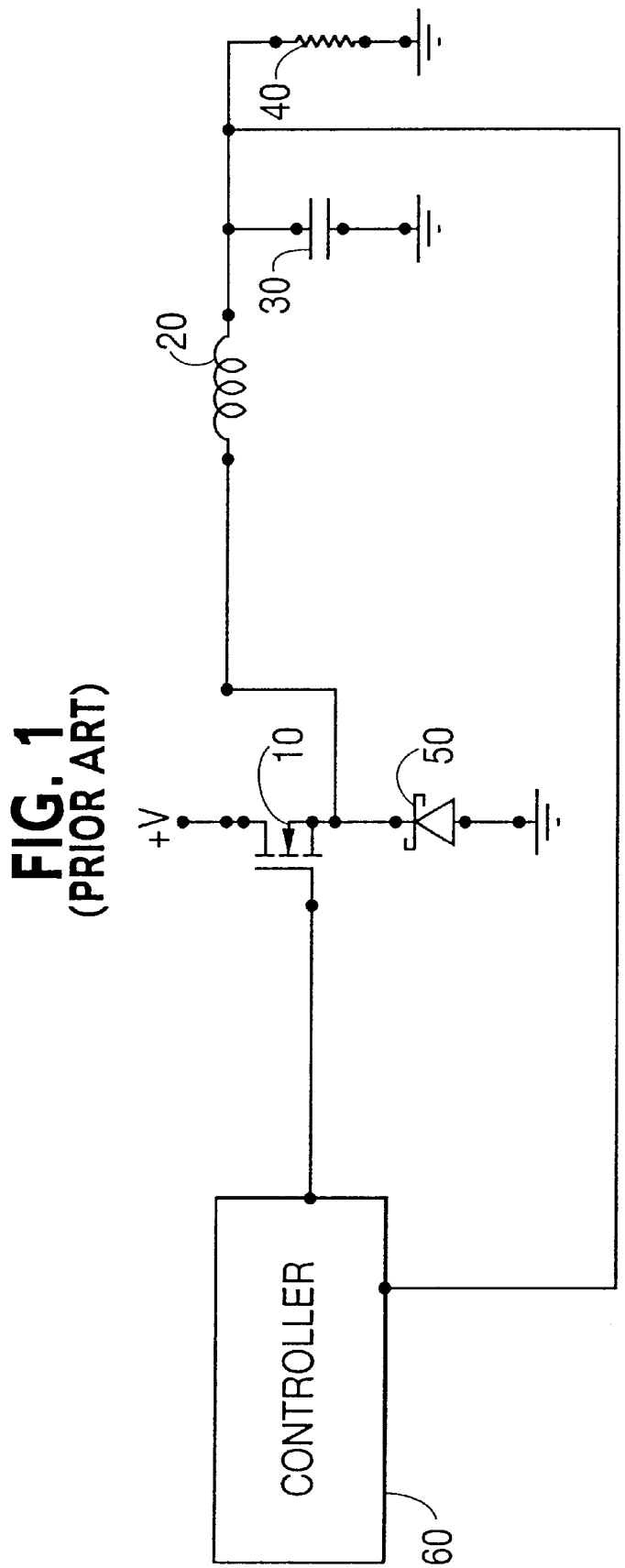
FIG. 1 shows a disadvantageous embodiment of a switching device.

Before beginning a detailed description of the invention, it should be noted that, when appropriate, like reference numerals and characters may be used to designate identical, corresponding or similar components in differing figure drawings. Further, in the detailed description to follow, example embodiments and values may be given, although the present invention is not limited thereto. Further, while example embodiments of the present invention will be described in conjunction with a buck regulator as an example, practice of the present invention is not limited thereto, i.e., the present invention can be implemented in conjunction with any switching device where power is wasted during a turn-on transition time, or produces and/or is connected to a circuit having a rapid dV/dt.

Figure 5:
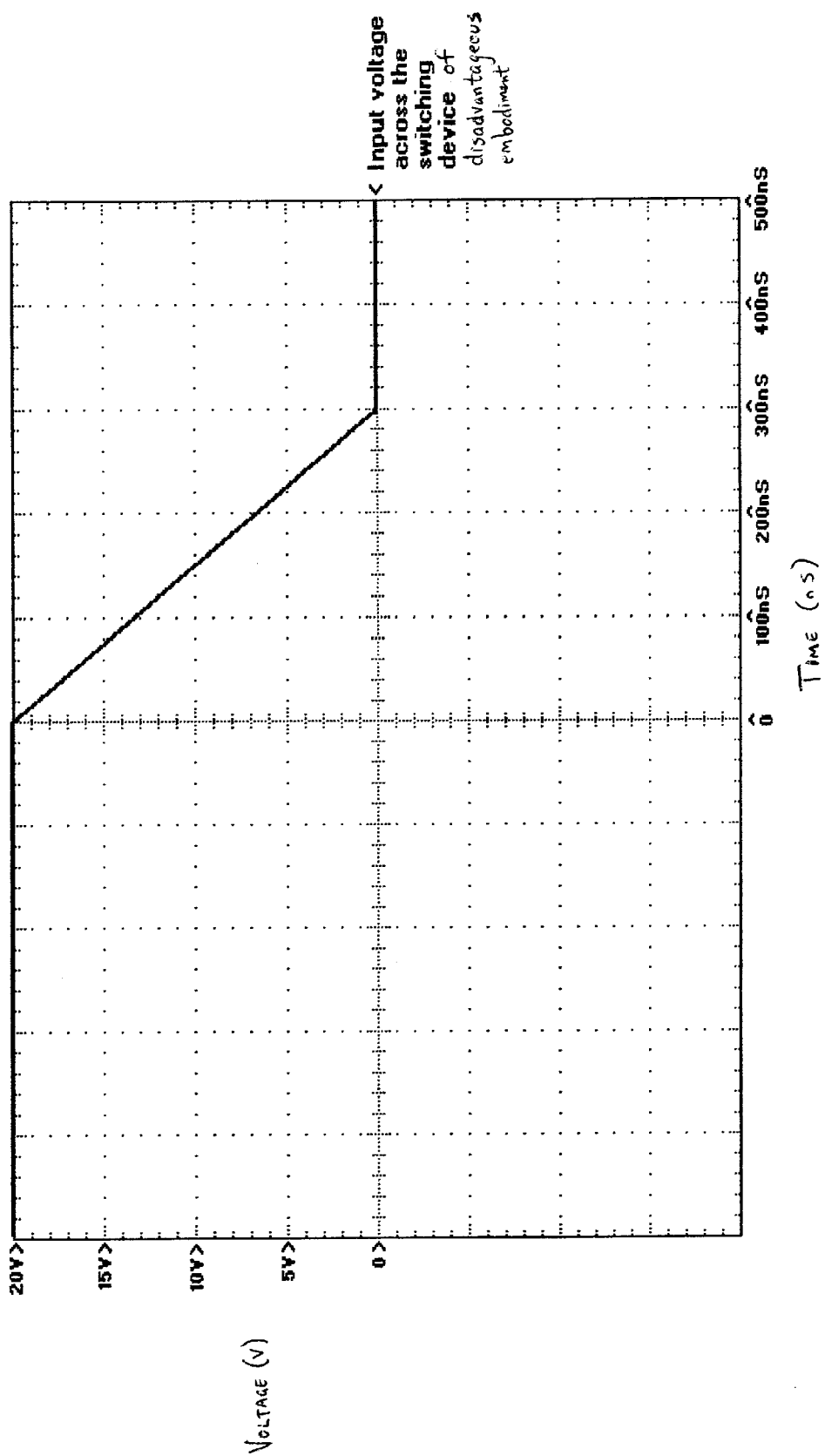
FIG. 5 shows a voltage waveform across a switch in the disadvantageous embodiment shown in FIG. 1.

As shown in the disadvantageous embodiment of FIG. 1, a significant amount of power is dissipated by the example buck regulator which utilizes a switching device 10 to switch the input of inductor 20 to the input voltage $^+V$ for a period of time, and then to disconnect inductor 20 from $^+V$ for a subsequent period of time. When switching device 10 switches, for example, 15A, the power being switched will be $15\times(^+V)$. If $^+V$ were 20V, then the power switched would be 300 watts, since (15A)(20V)=300 watts. If switching device 10 further requires, for example, 300 nS to switch on and to switch off, and has a repetitive period of ten microseconds (10 $\mu$S), then the switching device would consume 3.79 watts of power in switching losses. Since the load being switched in the disadvantageous embodiment is a constant current, the loss of power is calculated by a two-part formula:

$$P=\{I\tau_1(E_{max}+2E_{min})/6T\}+\{E_{max}\,I\tau_2/2T\}, \qquad (a)$$

wherein the first part of the formula $I\tau_1(E_{max}+2E_{min})/6T$ is determined during the first 50 nS when the current rises from 0A to 15A. $E_{max}$=20V and $E_{min}$=16.67V as shown in FIG. 5, which shows the voltage waveform across the switch in the disadvantageous embodiment of FIG. 1; further, I=15A, $\tau_1$=50 nS. The second part of the formula, $E_{max}\,I\tau_2/2T$, occurs after the first 50 nS of the 300 nS switching period of the switching device 10, and further still, $\tau_2$=250 nS, and T=10 $\mu$S.

Figure 3:
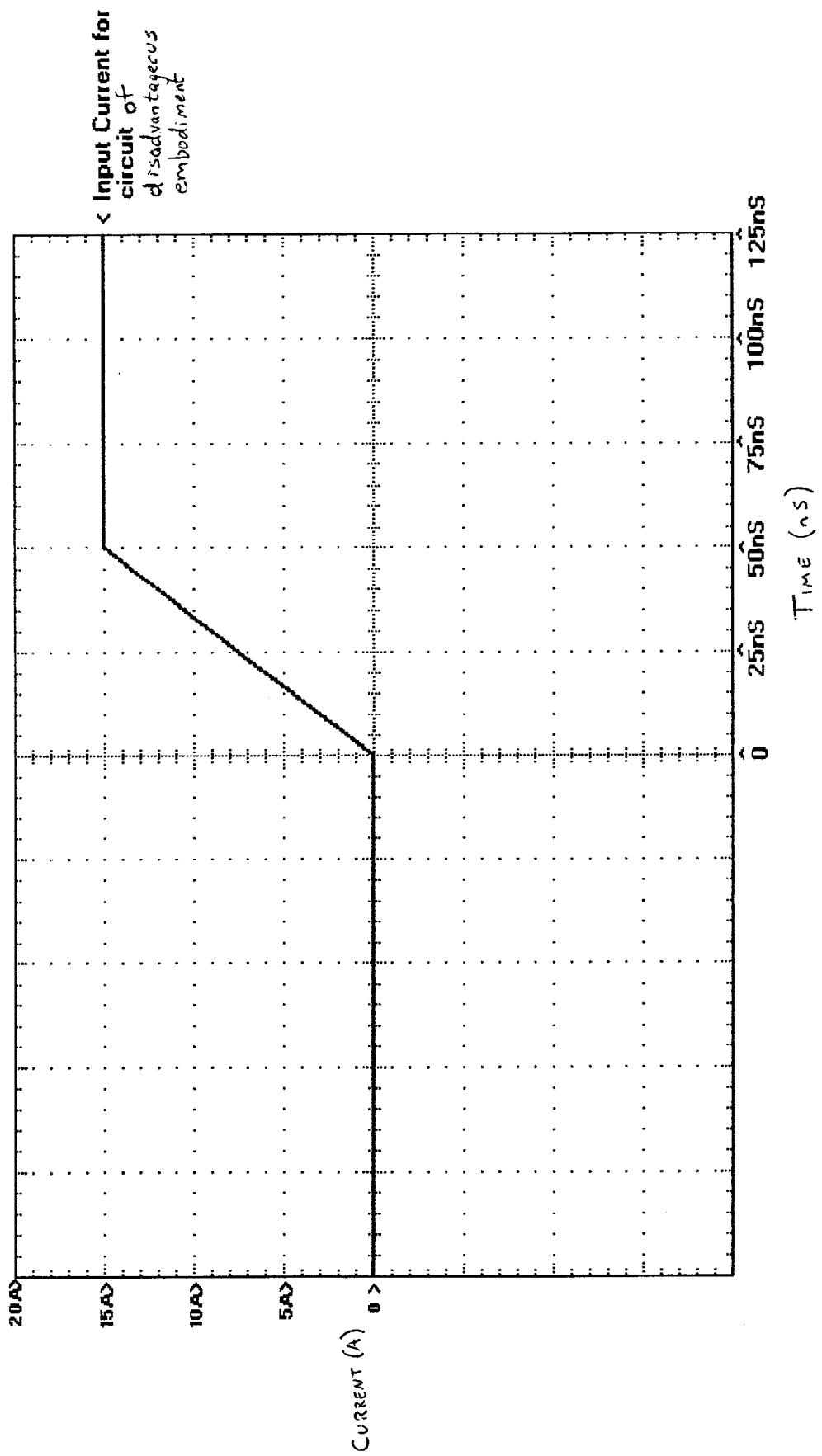
FIG. 3 shows a waveform of the current of a switch in the disadvantageous embodiment shown in FIG. 1.

FIG. 3 shows an example current waveform for switching device 10, and as set forth above, FIG. 5 shows an example voltage waveform across switching device 10 of the disadvantageous embodiment of FIG. 1. In accordance with the disadvantageous embodiment, the switching device 10 is fully turned on at 300 nS, switching the full device current of 15A in 50 nS, and switching completely on in 300 nS, so that the voltage across the switching device 10 will drop from 20V ($E_{max}$) to 0V in 300 nS, resulting in 3.79 watts of wasteful power being dissipated at the switching device during that transition turn-on time.

Figure 2:
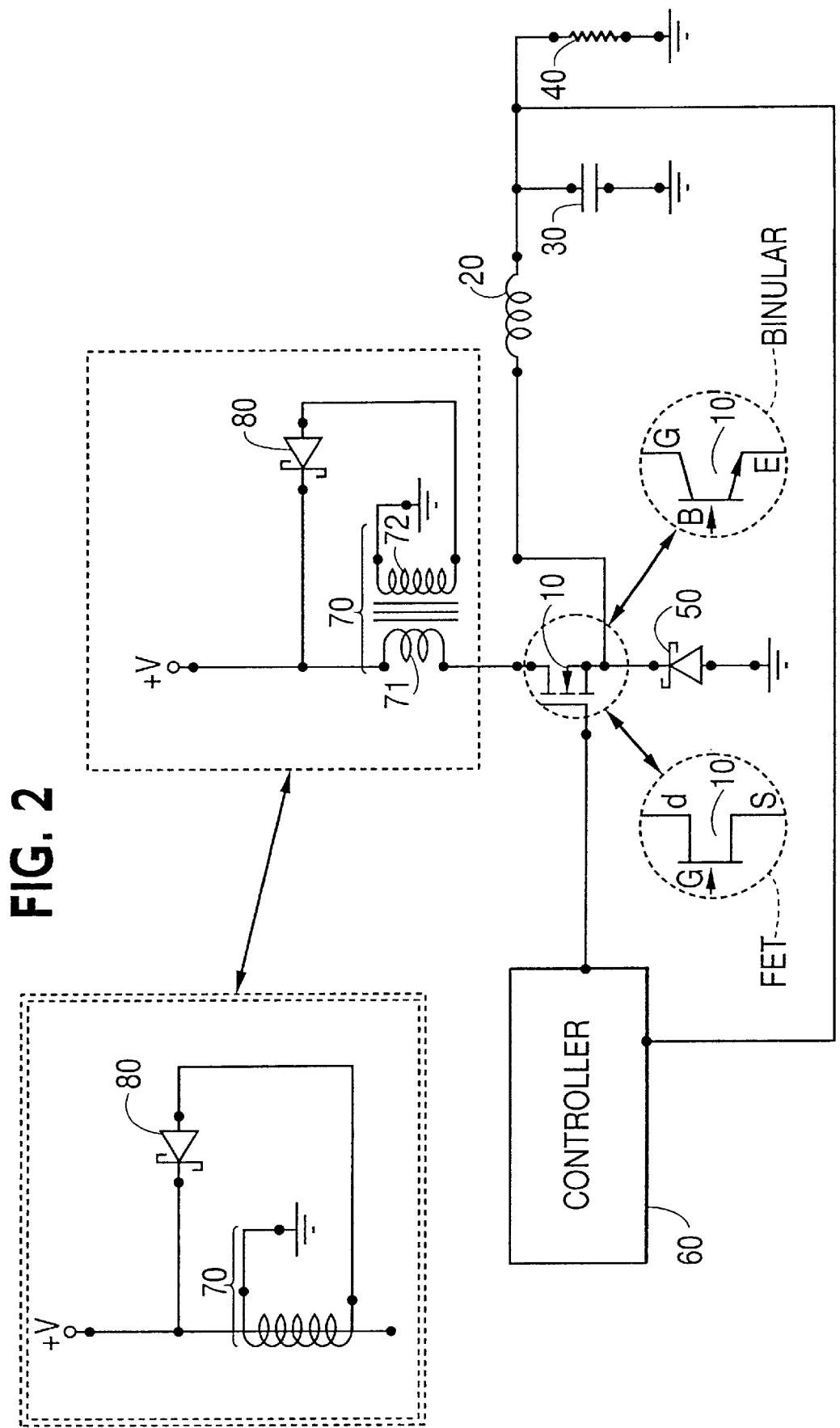
FIG. 2 shows a switching device according to an example embodiment of the present invention.

The present invention, an example embodiment of which is shown in FIG. 2, provides a switching device 10 which switches a voltage from $^+$V to the input of inductor 20 in an example buck regulator, as well. The buck regulator of the example embodiment of FIG. 2 includes an inductor 20, capacitor 30 and freewheel diode 50, controller 60 for controlling the duty cycle and switching device 10 for producing a first regulated output voltage across the capacitor 30 from a pulsed input supply. However, unlike the disadvantageous embodiment shown in FIG. 1, the example embodiment of the present invention shown in FIG. 2 includes the voltage source in series with a transformer 70 and a diode 80. Transformer 70 includes a primary inductor 71, and a secondary inductor 72 which is in series with a diode 80. Transformer 70 may also be a toroid with a straight wire passing through in series with the source or drain of switching device 10, although the transformer 70 is not limited to either implementation described above, i.e., all that is required is some type of current-delay/power-storage arrangement.

The primary inductor 71 of transformer 70 is in series with switching device 10. Although the present embodiment shows the primary inductor 71 of the transformer 70 is in series with the drain terminal of switching device 10, it could also be in series with the source terminal of switching device 10. Although switching device 10 is shown in the example embodiment of FIG. 2 as a MOSFET, practice of the present invention is certainly not limited to such implementation. That is, by the present invention, any type of switching device can be utilized, including, but not limited to, a synchronous MOSFET in a buck converter. So, regardless of the type of switching device, the implementation of transformer 70, as shown in FIG. 2 for example, slows down the rate of change of current on the drain or source of the switching device, thus reducing switching losses and any "shoot-through" thereat caused by a rapid rate of change of voltage across any device in the circuit of the switching device.

Similar to the example provided above, when the controller 60 provides, for example, a 10% duty cycle waveform turning on the switching device 10, the switching device 10 can take an extended period of time to turn on. The primary winding 71 is an inductor which provides a slow transfer of energy to the switching device 10. Thus, while the switching device 10 is turning on, the primary inductor 71 provides an inductance which limits the current during the turn-on time so that transistor 10 turns on with little current and a subsequent rapid voltage drop across the switching device, further reducing power loss. The current continues to increase through the inductor 71 to either the point of saturation of transformer 70 or the current being limited through inductor 20 and capacitor 30 into the load 40. That is, the transformer 70 either saturates or increases the current flow until it is limited by the circuit being switched, which is the buck converter inductor in the example embodiment of FIG. 2.

Figure 4:
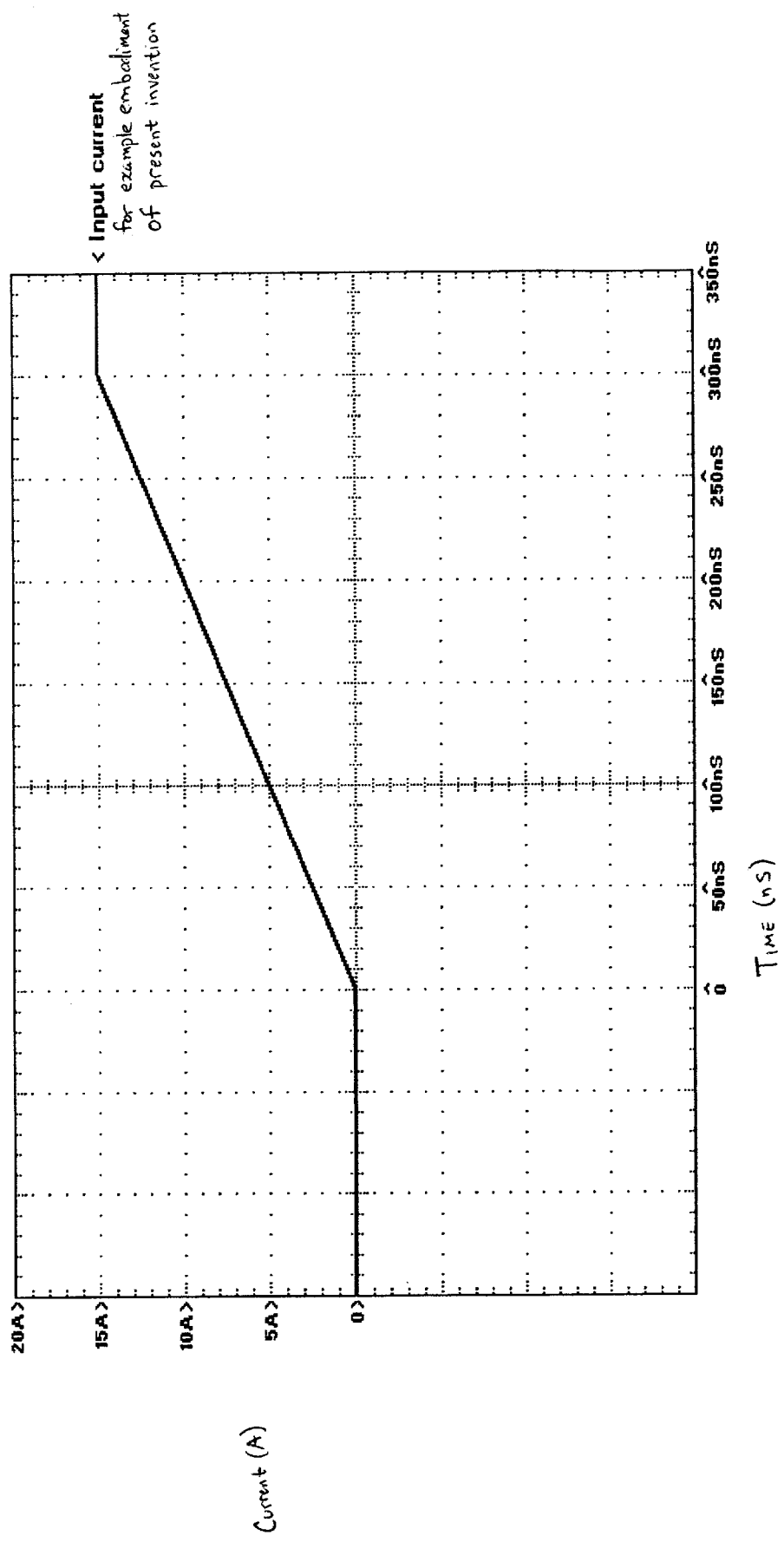
FIG. 4 shows a waveform of the current of a switch in the example embodiment of the present invention shown in FIG. 2.
Figure 6:
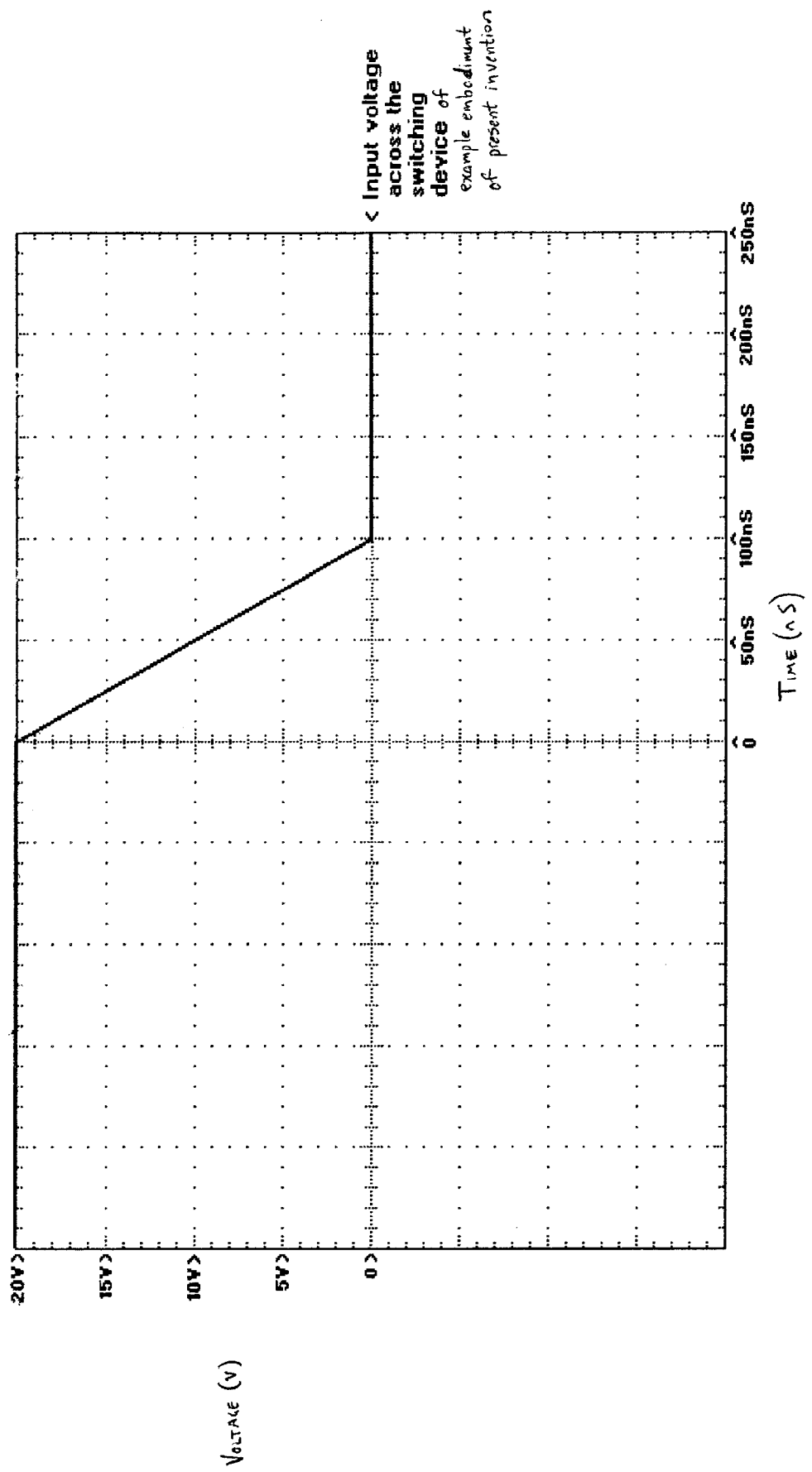
FIG. 6 shows a voltage waveform across a switch in the example embodiment of the present invention shown in FIG. 2.

As seen in the example current waveform of FIG. 4 and the example voltage waveform of FIG. 6, both corresponding to the example embodiment of FIG. 2, after the switching device 10 is turned on at 0S (zero seconds), since this embodiment also has a constant current being switched, the voltage across the switching device 10 goes to essentially 0V in 100 nS, as shown in FIG. 6. Therefore, the time that transition power is dissipated ($\tau$) is only 100 nS. Thus, according to the calculation of power dissipated P=($\tau$EI)/(6T), P={$(100\times10^{-9})(20)(5)$}/{$6(10\times10^{-6})$}=0.167 watts of power in switching losses. Thus, the loss of power according to the buck regulator provided in correspondence with the example embodiment of FIG. 2 is over 95% less than that of the same buck regulator provided in correspondence with the disadvantageous embodiment of FIG. 1, which dissipates 3.79 watts of power during the turn-on time.

Furthermore, according to the example embodiment of the present invention in FIG. 2, flux energy is stored in the secondary inductor 72 of transformer 70. Thus, when transistor 10 is turned off, the secondary inductor 72 transfers an energy level to a power receiving circuit, in this case $^+$V, as the stored energy in primary inductor 71 is transferred to the secondary inductor 72. Accordingly, a flyback effect occurs whereby the stored flux energy is then returned to the source voltage, in the present embodiment, via diode 80. The present invention is not limited to using a diode to feed the stored energy back to a power receiving circuit. That is, any means which will accomplish this function is valid for this purpose, including a synchronous rectifier.

Furthermore, it is noted that, although transformer 70 and diode 80 dissipate power themselves, such power dissipation is nominal relative to the power dissipated by the switch 10 in disadvantageous embodiments, an example of which is described above in reference to FIGS. 1, 3 and 5.

This concludes the description of the example embodiments. Although the present invention has been described with reference to illustrative embodiments thereof, it should be understood that numerous other modifications and embodiments can be devised by those skilled in the art that will fall within the scope and spirit of the principles of the invention. More particularly, reasonable variations and modifications are possible in the component parts and/or arrangements of the subject combination arrangement within the scope of the foregoing disclosure, the drawings and the appended claims without department from the spirit of the invention. In addition to variations and modifications in the component parts and/or arrangements, alternative uses will also be apparent to those skilled in the art.

I claim:

1. A method for limiting a switching current, said method comprising the steps of:

limiting a current sent and limiting a voltage drop (dV/dt) from a power source to a switching device during a turn on time of said switching device while storing the current limited by disposing a current-delay/power-storage device in series between said power source and said switching device and storing current limited in a power-storage device of the current-delay/power-storage device; and returning flux energy stored in said current-delay/power-storage device during the limiting of the current to a power receiving circuit during a turn off time of said switching device, wherein said power receiving circuit includes said power source.

2. A method as in claim 1, wherein said current-delay/power-storage device is an inductor.

3. A method as in claim 1, wherein said current-delay/power-storage device is a transformer.

4. A method as in claim 3, wherein said transformer has multiple windings.

5. A method as in claim 3, wherein said transformer has a first coil and a second coil.

6. A method as in claim 1, wherein said current-delay/power-storage device is a toroid having a wire passing therethrough to connect said power source to said switching device.

7. A method as in claim 5, wherein said first coil of said transformer limits the current sent from said power source to said switching device, and said second coil of said transformer returns the flux energy to said power receiving circuit.

8. A method for limiting a switching current, said method comprising the steps of:

limiting a current sent and limiting a voltage drop (dV/dt) from a power source to a switching device during a turn on time of said switching device while storing the current limited by disposing a current-delay/power-storage device in series between said power source and said switching device and storing current limited in a power-storage device of the current-delay/power-storage device; and returning flux energy stored in said current-delay/power-storage device during the limiting of the current to a power receiving circuit during a turn off time of said switching device, wherein said flux energy is returned from said current-delay/power-storage device to said power source via a diode disposed in series between said current-delay/power-storage device and said power source.

9. A method as in claim 1, wherein said switching device is a bipolar transistor.

10. A method as in claim 1, wherein said switching device is a field effect transistor.

11. A device for limiting a switching current, comprising:

a current-delay/power-storage device which limits a current sent and a voltage drop (dV/dt) from a power source during a turn on time of said device, said current-delay/power-storage device being disposed in series between said power source and said device; and a return path which returns flux energy stored in said current-delay/power-storage device during the limitation of the current and voltage drop to a power receiving circuit during a turn off time of said device, wherein said power receiving circuit includes said power source.

12. The device as in claim 11, wherein said current-delay/power-storage device is an inductor.

13. The device as in claim 11, wherein said current-delay/power-storage device is a transformer.

14. The device as in claim 13, wherein said transformer has multiple windings.

15. The device as in claim 13, wherein said transformer has a first coil and a second coil.

16. The device as in claim 11, wherein said current-delay/power-storage device is a toroid having a wire passing therethrough to connect said power source to said device.

17. The device as in claim 15, wherein said first coil of said transformer limits the current sent from said power source to said device, and said second coil of said transformer returns the flux energy to said power source.

18. The device as in claim 11, wherein said return path which returns the flux energy from said current-delay/power-storage device to said power source is a diode disposed in series between said current-delay/power-storage device and said power source.

19. The device as in claim 11, wherein said device is a bipolar transistor.

20. The device as in claim 11, wherein said device is a field effect transistor.

21. A method for reducing a voltage drop (dV/dt) in a circuit, said method comprising the steps of:

limiting a current sent from a power source to a switching device and limiting voltage drop (dV/dt) during a turn on time of said switching device by disposing a current-delay/power-storage device in series between said power source and said switching device; and returning flux energy stored in said current-delay/power-storage device stored during the limiting of the current a power receiving circuit during a turn off time of said switching device, wherein said power receiving circuit includes said power source.

22. A method as in claim 21, wherein said current-delay/power-storage device is an inductor.

23. A method as in claim 21, wherein said current-delay/power-storage device is a transformer.

24. A method as in claim 23, wherein said transformer has multiple windings.

25. A method as in claim 23, wherein said transformer has a first coil and a second coil.

26. A method as in claim 21, wherein said current-delay/power-storage device is a toroid having a wire passing therethrough to connect said power source to said switching device.

27. A method as in claim 25, wherein said first coil of said transformer limits the current sent from said power source to said switching device, and said second coil of said transformer returns the flux energy to said power receiving circuit.

28. A method for reducing a voltage drop (dV/dt) in a circuit, said method comprising the steps of:

limiting a current sent from a power source to a switching device and limiting voltage drop (dV/dt) during a turn on time of said switching device by disposing a current-delay/power-storage device in series between said power source and said switching device; and returning flux energy stored in said current-delay/power-storage device stored during the limiting of the current a power receiving circuit during a turn off time of said switching device, wherein said flux energy is returned from said current-delay/power-storage device to said power source via a diode disposed in series between said current-delay/power-storage device and said power source.

29. A method as in claim 21, wherein said switching device is a bipolar transistor.

30. A method as in claim 21, wherein said switching device is a field effect transistor.

31. A device for limiting a switching current, comprising:

a current-delay/power-storage device which limits voltage drop (dV/dt) and current across said device during turn on time, said current-delay/power-storage device being disposed in series between a power source of said current-delay/power-storage device and said device; and a return path to return flux energy stored in said current-delay/power-storage device when the current-delay/power-storage device is limiting power to a power receiving circuit during a turn off time of said device, wherein said power receiving circuit includes said power source.

32. The device as in claim 31, wherein said current-delay/power-storage device is an inductor.

33. The device as in claim 31, wherein said current-delay/power-storage device is a transformer.

34. The device as in claim 33, wherein said transformer has multiple windings.

35. The device as in claim 33, wherein said transformer has a first coil and a second coil.

36. The device as in claim 31, wherein said current-delay/power-storage device is a toroid having a wire passing therethrough to connect said power source to said device.

37. The device as in claim 35, wherein said first coil of said transformer limits the current sent from said power source to said device, and said second coil of said transformer returns the flux energy to said power source.

38. A device for limiting a switching current, comprising:

a current-delay/power-storage device which limits voltage drop (dV/dt) and current across said device during turn on time, said current-delay/power-storage device being disposed in series between a power source of said current-delay/power-storage device and said device; and a return path to return flux energy stored in said current-delay/power-storage device when the current-delay/power-storage device is limiting power to a power receiving circuit during a turn off time of said device, wherein said return path which returns the flux energy from said current-delay/power-storage device to said power source is a diode disposed in series between said current-delay/power-storage device and said power source.

39. The device as in claim 31, wherein said device is a bipolar transistor.

40. The device as in claim 31, wherein said device is a field effect transistor.

* * * * *